United States Patent [19]

Corville

[11] Patent Number: 4,498,832

[45] Date of Patent: Feb. 12, 1985

[54] WORKPIECE ACCUMULATING AND TRANSPORTING APPARATUS

[75] Inventor: Richard E. Corville, Alameda, Calif.

[73] Assignee: The BOC Group, Inc., Montvale, N.J.

[21] Appl. No.: 380,852

[22] Filed: May 21, 1982

[51] Int. Cl.³ ............................................. C23C 15/00
[52] U.S. Cl. ..................................... 414/217; 198/631
[58] Field of Search ................. 414/217; 198/774, 631; 118/50, 500

[56] References Cited

U.S. PATENT DOCUMENTS

| | | | |
|---|---|---|---|
| 3,521,765 | 7/1970 | Kauffman et al. .................. | 414/217 |
| 3,584,847 | 6/1971 | Hammond, Jr. et al. . | |
| 3,641,973 | 2/1972 | Shrader . | |
| 3,656,454 | 4/1972 | Shrader . | |
| 3,833,018 | 2/1973 | Brooks ............................. | 137/625.4 |
| 3,973,665 | 8/1976 | Giammanco .................... | 414/217 X |
| 4,047,624 | 9/1977 | Dorenbos . | |
| 4,209,087 | 6/1980 | Kushigian ........................... | 198/339 |
| 4,275,978 | 6/1981 | Brooks et al. . | |
| 4,311,427 | 1/1982 | Coad et al. . | |

FOREIGN PATENT DOCUMENTS

| | | |
|---|---|---|
| 2224684 | 10/1974 | France . |
| 2489276 | 3/1982 | France . |
| 56-21637 | 2/1981 | Japan . |
| 56-91427 | 7/1981 | Japan . |
| 57-63677 | 4/1982 | Japan . |
| 57-63676 | 4/1982 | Japan . |
| 1592758 | 7/1981 | United Kingdom . |

OTHER PUBLICATIONS

"Omega Breakthrough in Wafer Handling", Solid State Technology, p. 9, Mar. 1981.
John Gosch, "Sputtering System has High Yield", Jan. 17, 1980, vol. 53, No. 2, pp. 153-156, Electronics.

Primary Examiner—Robert J. Spar
Assistant Examiner—Stuart Millman
Attorney, Agent, or Firm—David A. Draegert; Larry R. Cassett

[57] ABSTRACT

A workpiece transporting apparatus particularly adapted to allow a rapid transfer of workpieces through a sealable opening between opposite sides of a wall, and thus rapid loading and unloading of vacuum processing or other sealable chambers. In a preferred embodiment, the apparatus employs a walking beam accumulator which comprises a first frame having a beam or rack with a series of locations for supporting a group of substrate holders, and a similar second frame mounted for rotation on an eccentric so that each holder supported by the first frame is removed, moved forward, and placed into an adjacent location on the first frame. The apparatus also employs a mechanism for relatively moving the walking beam accumulator and a workpiece receiver between a first position in which the wall opening can be sealed and a second position in which workpieces can be transferred between the accumulator and the receiver via the opening. In a preferred embodiment, the receiver is a rotatable drum inside a process chamber. The receiver may also be a second accumulator.

9 Claims, 10 Drawing Figures

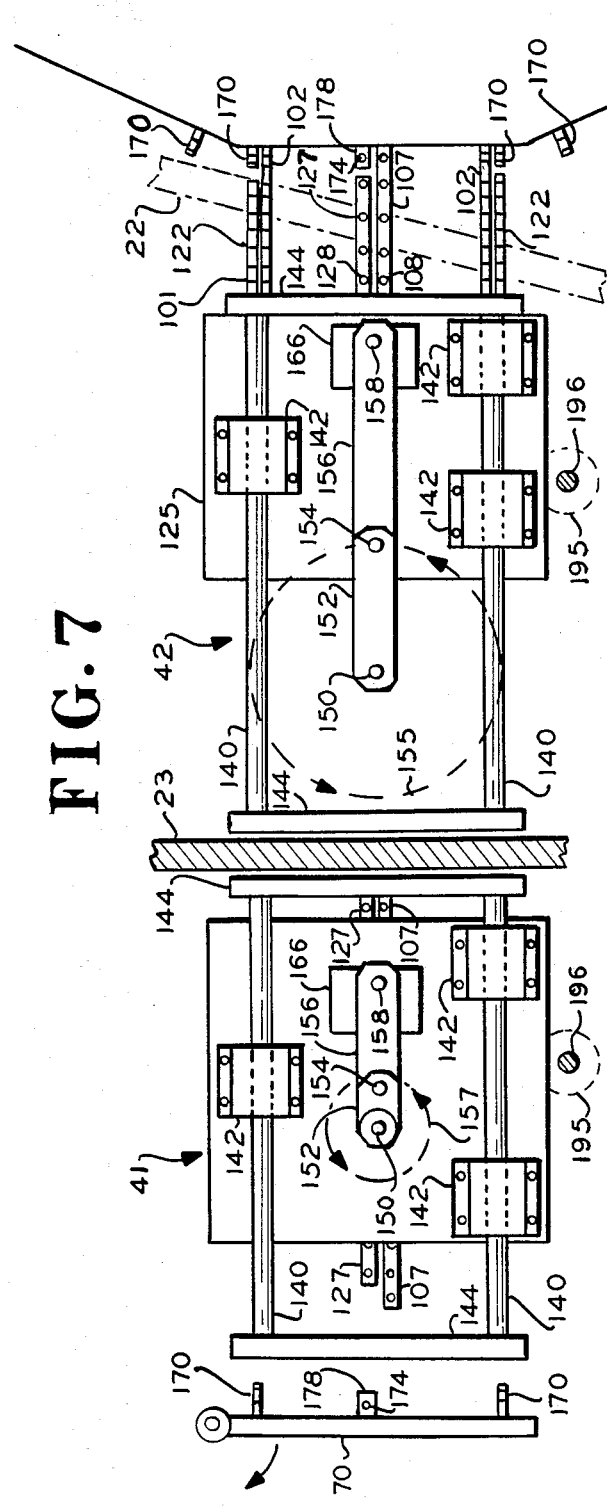
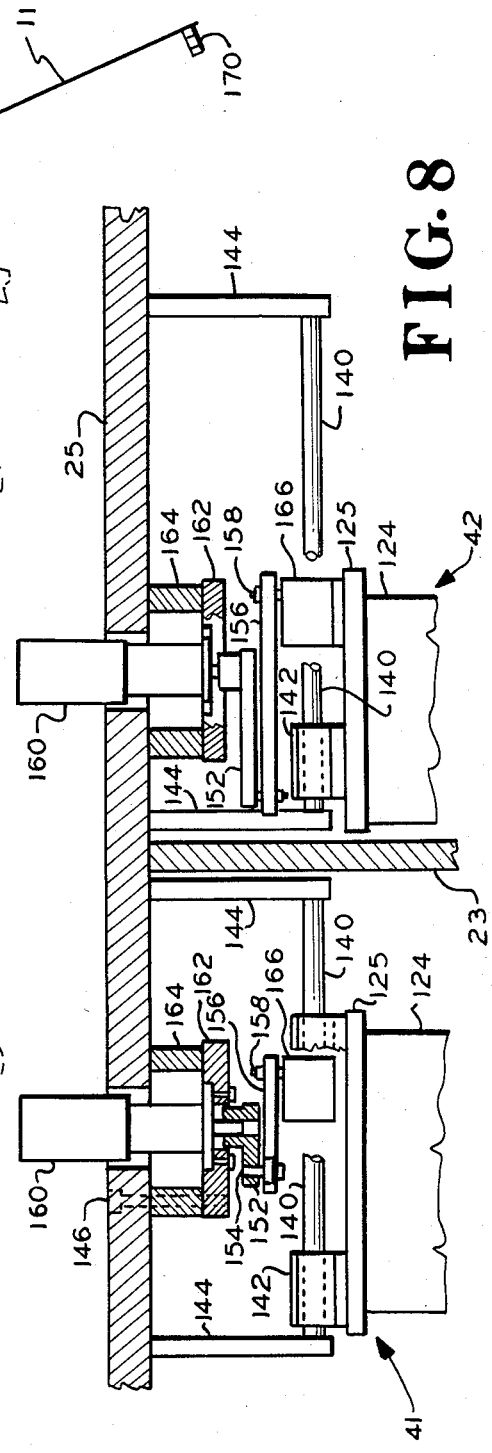

WORKPIECE ACCUMULATING AND TRANSPORTING APPARATUS

BACKGROUND OF THE INVENTION

1. Field of the Invention

The invention is in the field of transporting workpieces into and out of sealable chambers which are evacuated or maintained under some other extreme environment.

2. Description of the Prior Art

In order to obtain optimum production with most vacuum processing apparatus, particularly vacuum coating apparatus, the desired process pressure is maintained continuously in the chamber containing the coating or other process equipment. Workpieces enter and leave via an adjacent chamber, conventionally called a vacuum lock, which can be selectively opened to or isolated from the process chamber by a gate valve. Such an apparatus is described in U.S. Pat. No. 3,641,973 to Shrader. In some devices, such as that described in U.S. Pat. No. 3,656,454 to Shrader, the workpieces entered via one lock and left via a second lock. In both of these prior systems, a relatively large lock was required because the lock had to contain a large holder which could simultaneously expose twenty or more substrates to the coating equipment.

In the workpiece handling system of U.S. Pat. No. 3,584,847 to Hammond, Jr. et al, substrates were removed from a cassette in an entrance lock and placed horizontally onto a linear conveyor for processing. Processed substrates were placed in another cassette for removal from an exit lock. In the system of U.S. Pat. No. 4,047,624 to Dorenbos, a number of workpieces were placed in a cassette-like carrier which was placed on the open door of a vacuum lock. When the door was closed, the carrier was swung into the lock and was then conveyed through a gate valve into a holding chamber. The wafers were unloaded from the carrier and placed vertically onto a linear conveyor for processing. The processed wafers were loaded into another carrier and removed through an exit lock similar to the entrance lock.

Recently, cassette-to-cassette vacuum processing systems for semiconductor wafers have become commercially available. In some of these systems, wafers are removed from a cassette in a cassette elevator and placed onto a belt conveyor. The wafers are transferred through a vacuum lock onto a horizontal rotating table in a processing chamber by means of a rotary transfer arm. Processed wafers are removed through the same lock onto a second conveyor which deposits them in a cassette in a second cassette elevator. U.S. Pat. No. 4,311,427 to Coad et al describes a system for transferring wafers one at a time through a vacuum lock into (or out of) a cassette.

Several moving floor conveyors, including a so-called walking beam conveyor, are described in U.S. Pat. No. 4,275,978 to Brooks et al. In these conveyors, workpieces are supported on a horizontal array of slats. Several of the slats are rotated up out of the plane of the remainder so that an object placed on the array is lifted and advanced incrementally along the array.

SUMMARY OF THE INVENTION

The invention is a workpiece transporting apparatus particularly adapted to allow a rapid transfer of workpieces through a sealable opening between opposite sides of a wall, and thus rapid loading and unloading of vacuum processing or other sealable chambers. In a preferred embodiment, the apparatus employs a walking beam accumulator which comprises a first frame having a beam or rack with a series of locations for supporting a group of substrate holders, and a similar second frame mounted for rotation on an eccentric so that each holder supported by the first frame is removed, moved forward, and placed into an adjacent location on the first frame. The apparatus also employs a means for relatively moving the walking beam accumulator and a workpiece receiver between a first position in which the wall opening can be sealed and a second position in which workpieces can be transferred between the accumulator and the receiver via the opening.

The accumulator thus enables three functions: workpieces are stored, conveyed, and transferred between the accumulator and a separate receiver. In a preferred embodiment, the receiver is a rotatable drum inside a process chamber. The receiver may also be a second accumulator.

One important objective of the workpiece transporting apparatus of the preferred embodiment is to minimize the time required to load and unload the drum inside the process chamber. This time directly influences the throughput of the processing system, since it must be added to the actual process time, the time required for completing the process steps. It is also important to minimize the other transfer times within the system so that they can be accomplished during the process time and thus not extend the overall cycle time of the processing system.

A second important objective is to minimize the number of moving parts in the process chamber during processing, since such parts may be exposed to coating debris, corrosive gases, heat and optical radiation, or other harsh environmental conditions. In the preferred embodiment, this objective is obtained by the use of simple, passive hangers to support workpiece holders on the drum. Preferably, the workpiece holders are also simple, passive devices.

An advantage which is sometimes important is gentle handling of fragile workpieces, such as semiconductor wafers. Such workpieces are preferably mounted in holders which protect the wafer from undesired contact or other damage during subsequent handling. In certain situations, the holders may not be necessary and the workpieces can be handled directly.

Another advantage is accurate control of the location and orientation of the workpieces at all times. In a preferred embodiment, the accumulator engages the workpiece holders at both the top and bottom, and supports them in equally spaced, parallel, vertical planes. Other orientations are possible, but vertical orientation of substrates in vacuum is desirable to prevent contamination by falling debris.

The preferred embodiment is particularly adapted for vacuum use by minimizing the number, surface area and mechanical complexity of components which are exposed to vacuum. Reliable long term operation is facilitated by the use of rotating rather than sliding contact to minimize seizing of components.

BRIEF DESCRIPTION OF THE DRAWINGS

FIG. 7 is a plan view of two walking beam accumulators with the top of the lock removed for clarity.

FIG. 8 is a side view of the upper portion of the accumulators of FIG. 7.

DESCRIPTION OF THE PREFERRED EMBODIMENT

Figure 1:
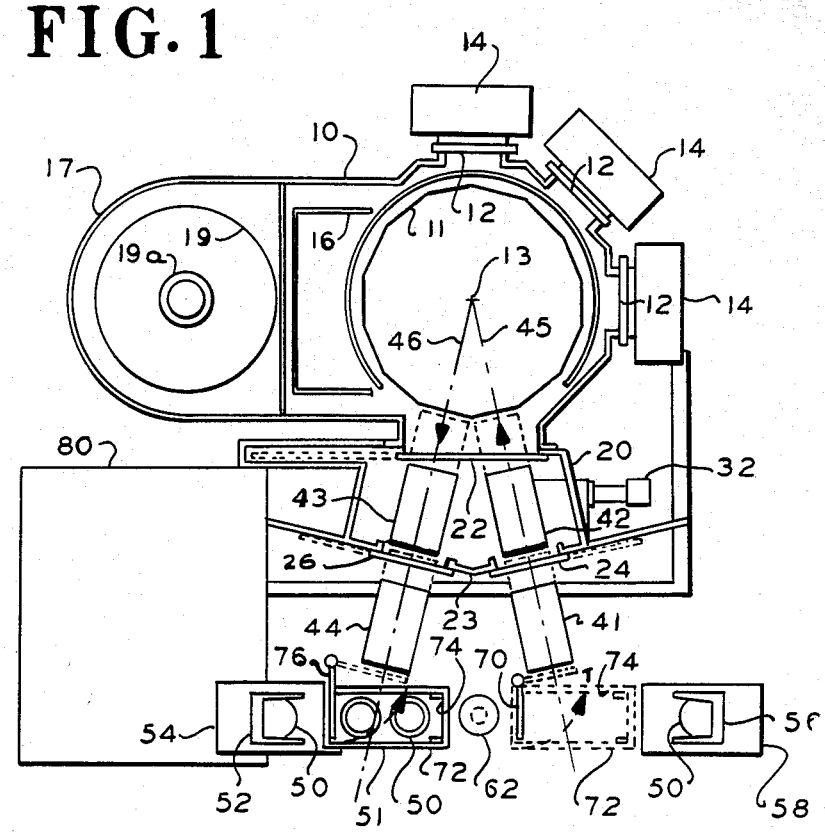
FIG. 1 is a plan view of a cassette-to-cassette vacuum processing system with the top covers of the process chamber and lock omitted for clarity.
Figure 2:
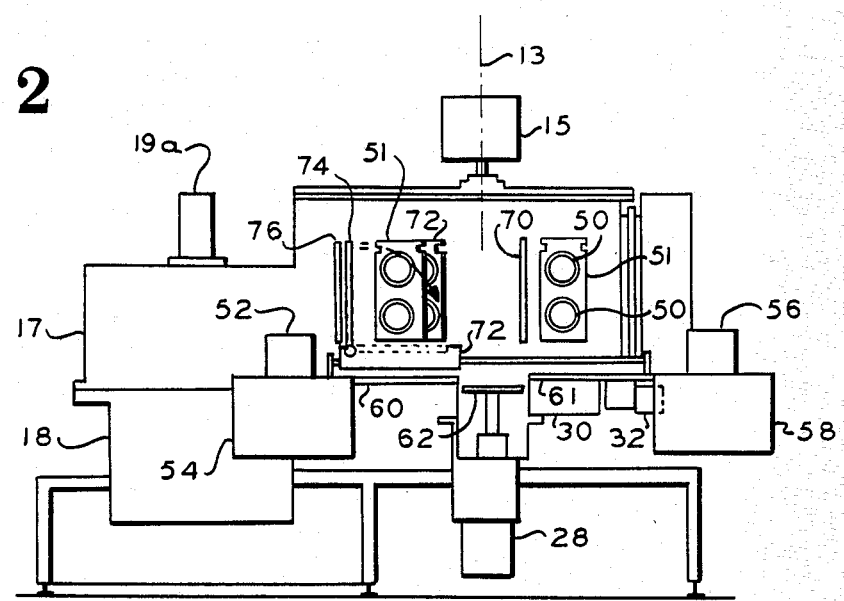
FIG. 2 is a front elevation view of the system of FIG. 1 with certain supporting structures omitted for clarity.

A vacuum processing system embodying the invention is shown in FIGS. 1 and 2. Specifically, the illustrated system is designed for plasma etching and sputter coating of workpieces, such as semiconductor wafers which are four or five inches in diameter. The system includes a process chamber 10 which contains three sputtering sources 12 and an area 16 which accommodates plasma etching, heating or other process equipment. The sputtering sources are connected to power supplies 14 mounted outside the process chamber. The process equipment is positioned around a fourteen-sided drum 11 which is mounted for rotation about a vertical axis 13 driven by a motor 15. During processing, the wafers are carried on up to thirteen sides of the drum 11; one side is available for process monitoring devices. Adjacent the process chamber 10 are a plenum 17 and a vacuum pump 18 for evacuating the process chamber. The vacuum pump can be isolated from the process chamber by a poppet valve 19 controlled by an actuator 19a.

One wall of process chamber 10 is fitted with a horizontally sliding gate valve 22 which can be moved to one side to enable communication between the process chamber and a separate vacuum lock 20. The bottom of lock 20 is fitted with another gate valve 30 which can be controlled by an actuator 32 to selectively connect the lock with a second vacuum pump 28. Another valve (not shown) enables the lock 20 to be connected to the outside atmosphere when the main gate 22 and pump gate 30 valves are closed. One wall 23 of lock 20 is fitted with two other horizontally sliding gate valves 24 and 26 which can then be opened without disturbing the vacuum condition in process chamber 10.

The wafer handling system transfers wafers from a first cassette 52 into the process chamber 10, and removes processed wafers from the chamber and places them in a second cassette 56. Cassette 52 is placed in a first cassette elevator 54 from which wafers are removed and placed on a belt conveyor 60 which advances toward the right in FIGS. 1 and 2. A wafer holder 51 is held in a horizontal position by a yoke 74 of a carriage 72. Each holder 51 is designed to accommodate two wafers. When an empty opening of a holder and an unprocessed wafer are aligned over a wafer elevator 62, the wafer is lifted into the opening where it is held by spring clips (not shown). The details of the spring clips, the elevators 54, 58 and 62, and the conveyors 60, 61 are only briefly described because they are not part of the present invention.

After a holder is filled with unprocessed wafers, the carriage is moved to the right to another position (dashed in FIG. 1) and the yoke is pivoted from a horizontal to a vertical position adjacent a first swinging panel 70. The panel 70 is raised a short distance to lift the holder from the yoke onto a pair of hangers 170 (FIG. 7). The panel 70 is swung about pivot 71 into a second position (dashed in FIG. 1) adjacent one end a first external accumulator 41 and the holder is transferred from the panel by the accumulator. The yoke is returned to its horizontal position and the carriage is returned for another holder. When the desired number of holders have been loaded, gate 24 is opened and the accumulator is moved partially through opened gate 24 to a second position (dashed in FIG. 1) in which the holders are loaded into a first lock accumulator 42. Next, the first external accumulator 41 is moved back to its first position, gate 24 is closed and the lock 20 is evacuated. When the lock pressure is approximately that of the process chamber 10, main gate 22 is opened and the internal accumulator 42 is moved partially through the opened gate 22 to a second position (dashed in FIG. 1) where one holder is transferred onto the face of the drum 11 aligned with the end of the accumulator 42. The drum is then rotated to align the next face on which a second holder is placed. When the drum is fully loaded, accumulator 42 is moved back to its first position, gate 22 is closed, and the wafers are processed as desired. During processing, lock 20 is vented and opened, a second group of substrate holders are loaded into the first lock accumulator 42, and the lock is again evacuated.

When the processing steps are completed, drum 11 is stopped and gate 22 opened. A second lock accumulator 43 is moved into a position (dashed in FIG. 1) to remove a holder from one face of the drum. The drum is then indexed so that a holder of unprocessed substrates can be placed on the empty face of the drum by accumulator 42, and so that a second holder of processed substrates can be removed by accumulator 43. The drum is repeatedly indexed until all of the processed substrates have been removed and replaced with unprocessed substrates. Accumulators 42 and 43 are moved back to their positions inside lock 20 and gate 22 is closed so that the process cycle can be repeated. Again, lock 20 is vented and gates 24 and 26 opened. A second external accumulator 44 is moved into a position (dashed in FIG. 1) to receive the holders of processed substrates from the lock accumulator 43.

Accumulator 44 is moved back to its first position and adjacent a second swinging panel 76 (dashed in FIG. 1) and the holders are transferred one at a time onto a pair of hangers on the panel. The swinging panel 76 and the pivoted yoke 74 are then moved to their positions shown in FIG. 2, and panel 76 is lowered slightly to transfer the substrate holder to the yoke. The yoke then pivots into its horizontal position (dashed in FIG. 2), and the carriage is moved until the first wafer in the holder is directly over wafer elevator 62. The wafer elevator removes the processed wafer from the holder and lowers it onto a second conveyor 61 which transfers the wafer into the second cassette 56 in the second cassette elevator 58. The first conveyor 60 is advanced to bring an unprocessed wafer from cassette 52 into alignment under the empty opening in the holder. The unprocessed wafer is placed in the opening and the carriage and conveyor are advanced to the right to align the second wafer which is then transferred to conveyor 61 and replaced with an unprocessed wafer as previously described.

Figure 3:
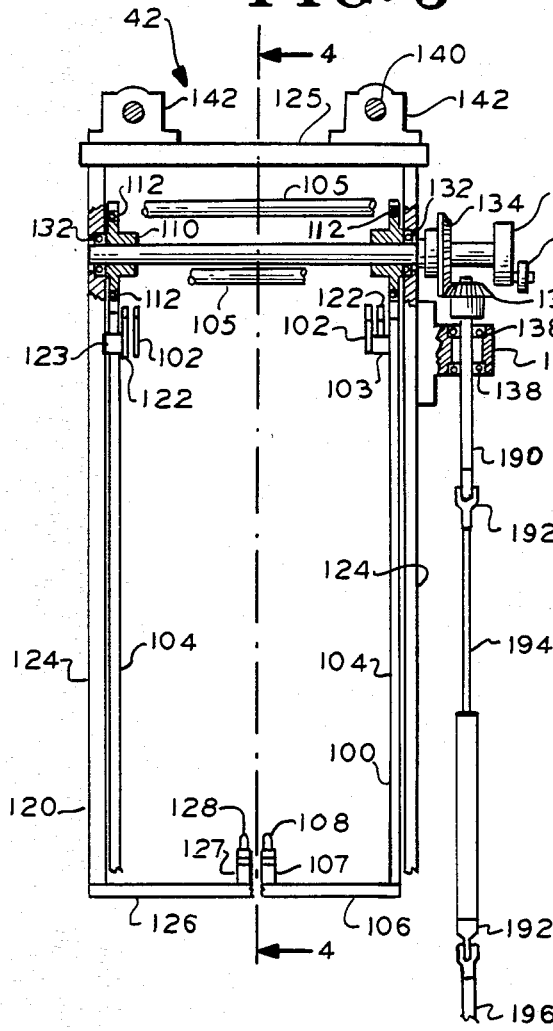
FIG. 3 is an end view, partially in cross section of a walking beam accumulator with certain supporting structures omitted for clarity.
Figure 4:
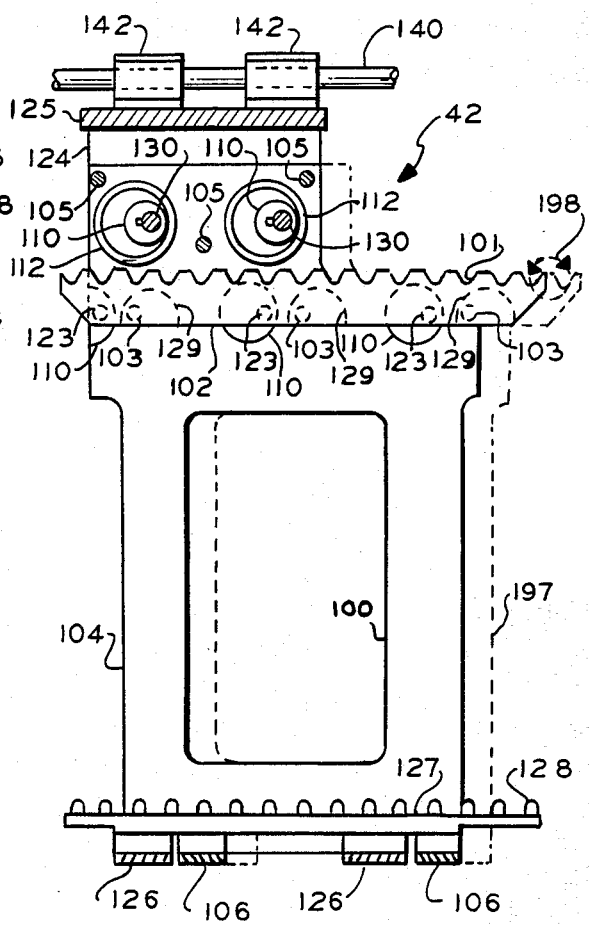
FIG. 4 is a cross-sectional view of the accumulator of FIG. 3 along the line 4—4.
Figure 5A:
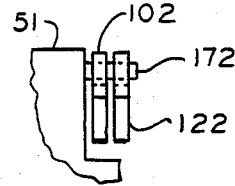
FIGS. 5A and 5B are front and side detail views of the upper corner of a wafer holder.
Figure 5B:
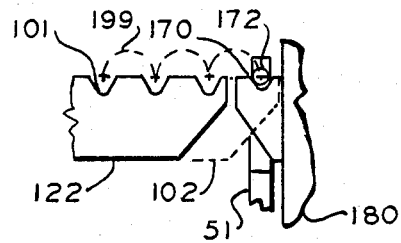
Figure 6A:
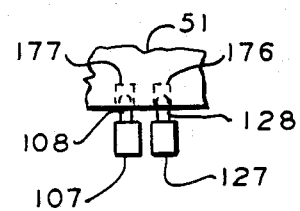
FIGS. 6A and 6B are front and side detail views of the bottom of a wafer holder.

The structure of the lock accumulator 42 is illustrated in FIGS. 3 and 4. The rotating frame 100 has two parallel side pieces 104 connected near the top by three rods 105 and near the bottom by two braces 106. A first horizontal rack 102 is mounted to each side 104 by three spacers 103. Each rack has a series of fifteen equally spaced pockets or slots 101 sized to accept rods 172 which extend from the two side edges of each holder 51 as shown in FIGS. 5A and 5B. The normal load is only thirteen holders; the two additional slots extend the racks for reaching the drum. Swinging of the holders is prevented by a row of fifteen pegs 108 which can engage a first hole 177 in the bottom edge of each holder 51 as shown in FIG. 6A. The pegs are equally spaced along a bar 107 which is fixed to the braces 106 attached to the bottom edges of sides 104. Hole 177 and the row of pegs 108 are complementary engaging means for maintaining the orientation of a holder while it is supported by the moving frame. This function could also be served by a peg on the holder and a row of holes in the bar 107. The rotating frame is mounted for rotation on the outer races of two pairs of circular bearings 112. The inner races of each pair of bearings are mounted on the outside diameters of a pair of eccentrics 110 fixed to a shaft 130. The rotation of the two shafts 130 are coupled by cranks 116 connected by a link 118.

Figure 6B:
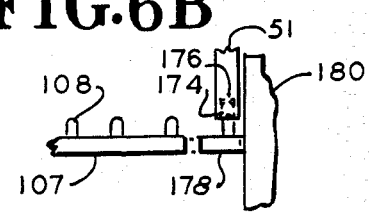

The fixed frame 120 has two parallel sides 124 which extend above the sides of the rotating frame and are connected by a top piece 125. A second horizontal rack 122 is mounted to each side 124 by three spacers 123. Again, each rack has a series of fifteen equally spaced slots 101. The two sides 124 are connected at the bottom by braces 126 which support a second row of fifteen pegs 128 on a bar 127. Pegs 128 engage a second hole 176 in the bottom of each holder 51 as shown in FIGS. 6A and 6B. The two shafts 130 are mounted for rotation in two pairs of bearings 132 placed in each side 124.

Rotation of shafts 130 is enabled by a gear 134 on one shaft 130 and a gear 136 on a shaft 190 mounted in bearings 138 in a block 137 on the side of the fixed frame. Shaft 190 is coupled by a first universal joint 192, a telescoping shaft 194 and a second universal joint 192 to a shaft 196. Rotation of shaft 196 and of the rotating frame is controlled by a motor 195 (FIG. 7) located outside and below the lock and near the mid-point of travel of the accumulator between its first and second positions.

When the shaft 196 is rotated through 180°, the rotating frame 100 moves from the position shown in the solid outline in FIG. 4 to the position indicated by the dashed outline 197. As this rotation is continued, as indicated by the dashed small circle 198 in FIG. 4, holders 51 are moved forward into successive slots 101 along the fixed racks 122 as indicated by the series of half-circles 199 in FIG. 5B. Reversal of the direction of rotation, reverses the direction of motion of the holders.

Clearance holes 110 in the sides 104 of the moving frame allow clearance for spacers 123 of the fixed rack 122. Similarly, cutouts 129 in the fixed rack 122 allow clearance for spacers 103 of the rotating rack 102.

Accumulator 42 has three linear bearings 142 attached to its top 125 to enable it to move along a pair of parallel rods 140 supported by hangers 144 from the roof 25 of lock 20 as shown in FIGS. 7 and 8. FIG. 8 shows accumulator 42 in its position inside lock 20 and corresponding to the solid outline shown in FIG. 1. FIG. 7 shows accumulator 42 moved forward to the position shown in the dashed outline in FIG. 1. Motion between these two positions is enabled by a motor 160 which extends into the load lock through a hole in the top 25. Recessed screws 146, motor mounting plate 162 and ring 164 provide a vacuum seal. A crank arm 152 fitted on the shaft 150 of the motor is connected to one end of a link 156 by a first pivot 154. A second pivot 158 connects the other end of link 156 to a block 166 mounted to the top 125 of accumulator 42. Rotation of motor 160 causes the pin 154 to move around the dashed circle 155 in FIG. 7 and thus accumulator 42 is moved between its two positions.

When accumulator 42 is in the position shown in FIG. 7, the fixed 122 and rotating 102 racks extend through the open gate 22 and can be aligned with a pair of hangers 170 mounted on the faces of drum 11. When the rotating frame is activated by shaft 196, a holder in the end slot of the fixed rack is lifted and lowered into similar slots on a pair of hangers 170 as shown in FIG. 5B. As shown in FIG. 6B, hole 176 of the holder is engaged by a peg 174 on a short bar 178 mounted to a carrier 180 which may be the drum 11 or either of the panels 70 or 76. Reversing the direction of rotation enables the rotating frame to remove a holder from the hangers on the drum and lower it into the end slot on the fixed racks.

Most features of external accumulator 41 are the same as lock accumulator 42 and corresponding reference numbers have been used in FIGS. 7 and 8. However, the rotating rack of accumulator 41 has fourteen slots and the fixed rack has thirteen slots for supporting substrate holders. The additional slot on the moving rack enables the accumulator 41 to transfer a holder to or from the end slot of accumulator 42 when the accumulators are adjacent as when the gate 24 in wall 23 is open. In addition, accumulator 41 can transfer a holder from (or to) a pair of hangers 170 mounted on the first swinging panel 70 as shown in FIG. 7. The extent of linear motion of accumulator 41 is less than that of accumulator 42 as indicated by the smaller dashed circle 157 in FIG. 7.

The lock accumulators 42 and 43 are identical, as are the external accumulators 44 and 41. In the preferred embodiment, the first and second sets of accumulators 41, 42 and 43, 44 move radially along first and second lines 45 and 46 (FIG. 1) which are normal to adjacent faces of drum 11. If desired, accumulators 42 and 43 may be placed in separate locks.

The sequencing of the movement of the elevators (54,58,62), carriage 72, conveyors (60,61), panels (70,76), accumulators (41–44), gate valves (22,24,26), and drum 11, as well as the entire operation of the process equipment is accomplished by conventional automatic control equipment 80.

With a rotating frame rotation rate of 30 revolutions per minute, a load of thirteen holders can be transferred between the external and lock accumulators in about 1 min. and the drum can be loaded in about 1.5 min. With a process time of 12 min., the entire system can process wafers at a rate of about 100 wafers per hour.

Numerous other embodiments and variations may be conceived from the teachings of this specification. The scope of the present invention is defined by the following claims.

What is claimed is:

1. An apparatus for vacuum processing of workpieces, comprising:
    a sealable chamber;
    a receiver for receiving and simultaneously supporting a plurality of workpieces inside the chamber;
    a lock adjacent the chamber;
    a first gate between the lock and the chamber having an opening through which workpieces can pass;
    means for evacuating the chamber and the lock;
    a first walking beam accumulator;
    means for moving the first accumulator between a first position in which the first accumulator is entirely inside the lock, and a second position in which workpieces can be transferred between the first accumulator and the receiver via the first gate opening; and
    means for operating the first walking beam accumulator to transfer a plurality of workpieces between the first accumulator and the receiver.

2. The apparatus of claim 1, further comprising:
    a second gate in the lock having an opening through which workpieces can pass;
    a second walking beam accumulator;
    means for moving the second accumulator between a first position in which the second accumulator is entirely outside the lock and the chamber, and a second position in which workpieces can be transferred between the first and second accumulators via the second gate opening; and
    means for operating the first and second walking beam accumulators to transfer a plurality of workpieces between them.

3. The apparatus of claim 2, further comprising:
    a third walking beam accumulator; and
    means for moving the third accumulator between a first position in which the third accumulator is entirely outside the chamber, and a second position in which workpieces can be transferred between the third accumulator and the receiver; and
    means for operating the third accumulator to transfer a plurality of workpieces between the third accumulator and the receiver.

4. The apparatus of claim 3, further comprising:
    a fourth walking beam accumulator; and
    means for moving the fourth accumulator between a first position in which the fourth accumulator is entirely outside the lock and the chamber, and a second position in which workpieces can be transferred between the third and fourth accumulators; and
    means for operating the third and fourth accumulators to transfer a plurality of workpieces between them.

5. The apparatus of claim 2, further comprising
    first workpiece carrier mounted outside the chamber and the lock;
    second workpiece carrier located outside the chamber and the lock; and
    a pivot for swinging the first carrier between a first position in which workpieces can be transferred between the first carrier and the second accumulator, and a second position in which workpieces can be transferred between the first and second carriers.

6. The apparatus of claim 1, further comprising:
    a second walking beam accumulator; and
    means for moving the second accumulator between a first position in which the second accumulator is entirely outside the chamber, and a second position in which workpieces can be transferred between the second accumulator and the receiver; and
    means for operating the second accumulator to transfer a plurality of workpieces between the second accumulator and the receiver.

7. The apparatus of claim 6 wherein the receiver is a multi-sided drum mounted for rotation about an axis, and the first and second accumulators move along radii extending from the axis and normal to separate sides of the drum.

8. The apparatus of claim 1 wherein the walking beam accumulator comprises:
    first and second racks each having a series of slots for supporting workpieces;
    means for rotating the second rack to remove a workpiece from a slot in the first rack and to place it in an adjacent slot in the first rack; and
    first and second rows of means for engaging the workpieces and maintaining the workpieces in a desired orientation while they are supported by the racks.

9. The apparatus of claim 1, further comprising:
    a second gate in the lock having an opening through which workpieces can pass;
    a second walking beam accumulator;
    means for relatively moving the first and second accumulators between a first position in which the second accumulator is entirely outside the lock and the chamber and the second gate opening can be sealed, and a second position in which workpieces can be transferred between the first and second accumulators via the second gate opening; and
    means for operating the first and second walking beam accumulators to transfer a plurality of workpieces between them.

* * * * *